United States Patent
Drummond

(10) Patent No.: US 7,506,014 B2
(45) Date of Patent: Mar. 17, 2009

(54) TUNABLE MULTI-PHASE-OFFSET DIRECT DIGITAL SYNTHESIZER

(76) Inventor: Malcolm Drummond, 60 Marberth Dr., Henrietta, NY (US) 14467

( * ) Notice: Subject to any disclaimer, the term of this patent is extended or adjusted under 35 U.S.C. 154(b) by 721 days.

(21) Appl. No.: 10/914,046

(22) Filed: Aug. 6, 2004

(65) Prior Publication Data
US 2006/0031273 A1   Feb. 9, 2006

(51) Int. Cl.
*G06F 1/02* (2006.01)
(52) U.S. Cl. .................................. 708/271; 708/272
(58) Field of Classification Search .............. 708/271, 708/272
See application file for complete search history.

(56) References Cited

U.S. PATENT DOCUMENTS

| | | | | |
|---|---|---|---|---|
| 4,454,486 A * | 6/1984 | Hassun et al. | ............. | 332/117 |
| 4,992,743 A * | 2/1991 | Sheffer | ............. | 327/106 |
| 5,598,437 A * | 1/1997 | Gourse | ............. | 375/308 |
| 5,770,977 A * | 6/1998 | Uurtamo | ............. | 331/40 |
| 5,844,369 A * | 12/1998 | Yoshizako et al. | ..... | 315/111.21 |
| 6,940,937 B2 * | 9/2005 | Xiu et al. | ............. | 375/376 |
| 2005/0060109 A1 * | 3/2005 | Caffrey et al. | ............. | 702/65 |

OTHER PUBLICATIONS

Direct Digital Synthesis—Some Options for FPGA Implementation, Sep. 19-22, 1999.
Section 1. Fundamentals of DDS Technology, 1999, Analog Devices, Inc.

* cited by examiner

*Primary Examiner*—Chuong D Ngo
(74) *Attorney, Agent, or Firm*—Harness, Dickey & Pierce, P.L.C.

(57) ABSTRACT

A plasma control system including a direct digital synthesizer (DDS) for generating more than one individual RF power signal, where the individual RF power signals are combined to define a combined RF power signal. The DDS includes an accumulator which receives a phase increment signal that defines a frequency of a frequency signal generated by the accumulator. The frequency signal is split and input to a plurality of adders. Each adder receives a phase offset signal that defines a phase shift of the frequency signal input to that particular adder. The phase increment signal and phase offset may be stored to reduce the startup portion of the plasma control system.

2 Claims, 2 Drawing Sheets

TUNABLE MULTI-PHASE-OFFSET DIRECT DIGITAL SYNTHESIZER

FIELD OF THE INVENTION

The present invention relates to a circuit for varying the frequency in a plasma control system and, more particularly, a multiple direct digital synthesizer (DDS) system with tunable frequency and phase offsets.

BACKGROUND OF THE INVENTION

In a conventional configuration of a plasma control system, the output from a number of power generators is combined at a combiner in order to provide a composite RF output signal which is applied to a plasma chamber. Such a configuration enables sufficient power levels to be applied to the plasma chamber, where any one individual power generator could not provide sufficiently high power levels.

In such systems, a main controller must synchronize both the frequency and phase of each power generator. Each power generator must be configured within the system so that the individual power signals output from each power generator possess a desired frequency and phase difference to provide the desired output power in the combined RF output signal. Such synchronization requires an extended start up period. In particular, a first power generator unit is defined as a master power generating unit. The unit outputs a power generation signal having a specific frequency and phase. This master power generator unit defines a starting point to which additional power generation units are slaved in terms of both frequency and phase.

The frequency and phase of each slave power generation unit are then varied in order to provide a combined RF output signal having a desired, typically a maximum, power at a predetermined, desired frequency.

In order to obtain synchronization, a digital logic loop (DLL) is utilized to analyze the combined RF output signal and generate the respective frequency and phases of each slave generation unit in order to achieve the desired power at a predetermined frequency of the combined RF output signal. Tuning the RF power signal using DLL proves to be undesirably timely and extends the start up period of the plasma control system each time the system is restarted because each RF power generation unit requires calibration upon every startup. More particularly, each RF power generation unit must be tuned to account for cable length, connections, and the like in order to output the optimal combined RF power output signal. Further, conventional, multiple DDS systems do not provide for frequency or phase shifting of individual RF power generation units or the combined RF power output signal without recalibrating the master and slave individual RF power generation units using the DLL. This makes such frequency and phase shifting impractical. Accordingly, the output of each individual power generator cannot be adjusted without readjusting the other individual RF power generation units. It is, rather, the combined RF output signal which must be examined in order to determine whether the respective power generator units have been calibrated correctly.

SUMMARY OF THE INVENTION

A direct digital synthesizer (DDS) including an accumulator that receives a phase increment signal and generates a frequency signal having frequency information, the frequency signal varying in accordance with the phase increment signal, the frequency signal being split into a plurality of frequency signals. The DDS also includes a plurality of adders, each adder receiving a respective one of the split frequency signals. Each adder also receives a respective phase offset signal which defines a phase shift for the frequency signal input to the respective adder. Each adder of plurality of adders output a phase shifted frequency signal.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
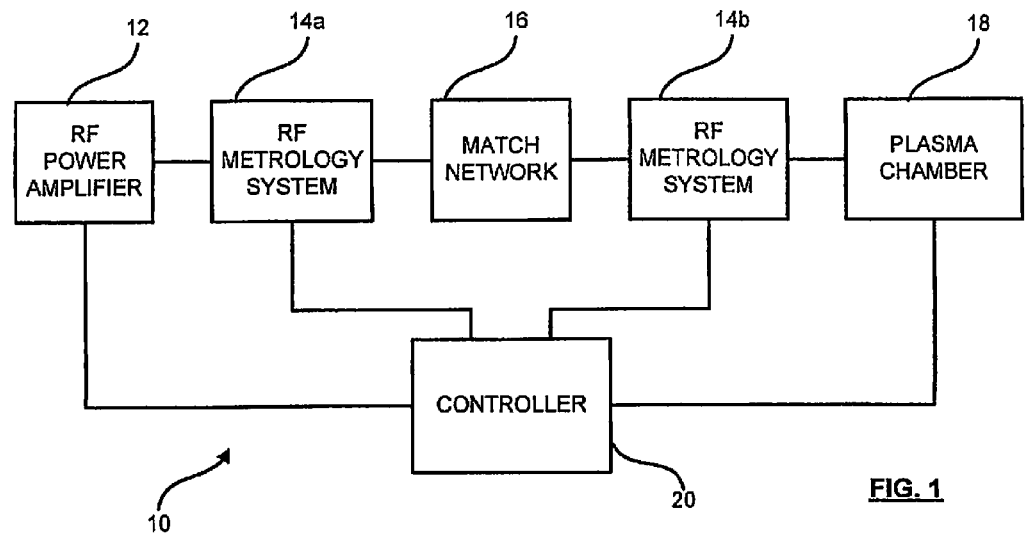
FIG. 1 is a block diagram of a plasma control system.

FIG. 1 depicts a control system in which the direct digital synthesizer (DDS) of the present invention may be implemented for controlling a plasma chamber. Control system 10 includes a plasma chamber 18, such as may be used for fabricating integrated circuits or flat panel displays. Plasma chamber 18 includes one or a plurality of gas inlets and one or a plurality of gas outlets (not shown). The gas inlets and outlets enable the introduction and evacuation of gas from the interior of plasma chamber 18. A controller 20 receives inputs from the plasma chamber, which may include a vacuum signal which indicates the level of vacuum in the chamber, a voltage signal, and a signal indicating the ratio of flows between the inlet and outlet gases. As one skilled in the art will recognize, other inputs/outputs may also be received/generated by controller 20. Controller 20 determines a desired input power to be applied to plasma chamber through a power supply or RF power amplifier 12. RF power amplifier 12 may optionally include a microprocessor, or other similar controller, which receives the applied signal from controller 20. RF power amplifier 12 outputs a RF signal which is input to RF metrology system 14a. The RF signal passes through RF metrology system 14a to match network 16 which matches impedances between RF power amplifier 12 and plasma chamber 18.

A first RF metrology system 14a is interposed between RF power amplifier 12 and match network 16. A second RF metrology system 14b is interposed between match network 16 and plasma chamber 18. RF metrology systems 14a, 14b measure voltage and current output by respective RF power amplifier 12 and match network 16. RF metrology systems 14a, 14b are selected and installed in accordance with particular design considerations. One or both of RF metrology systems may be used. For convenience RF metrology systems 14a, 14b will be referred to using only reference numeral 14 without letters. RF metrology system 14 provides feedback signals to controller 20. It will be recognized by one skilled in the art the FIG. 1 depicts a simplified block diagram of a control system 10 and that various feedback and control paths may be implemented in a control system. Such implementations depend upon particular design considerations.

One primary function of controller 20 is to provide signals to RF power amplifier 12 to vary the RF power applied to plasma chamber 18. In one configuration, RF power amplifier 12 is actually comprised of a one or a plurality of RF power generation units each of which outputs an individual RF power signal which is combined with the individual RF power signals from other RF power generation units by a combiner for output to RF metrology system 14a. This technique of combining the individual RF output signal of multiple power generation units with in an RF power amplifier 12 enables RF power amplifier 12 to generate a combiner RF output signal having power levels which are the sum of the individual RF output signals. This concept of combining individual RF power signals can be implemented in multiple stages. That is, two sets of four individual RF power generation units can be combined to provide two combined RF output signals which in turn can be combined as well.

Figure 2:
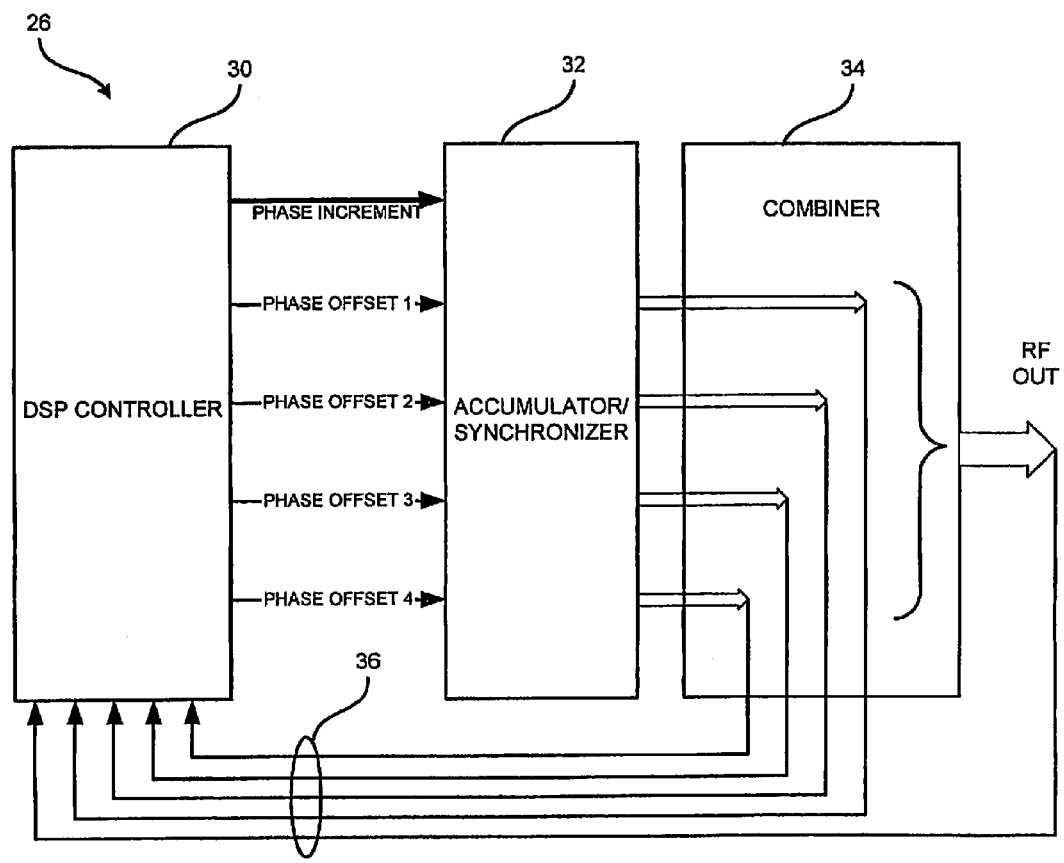
FIG. 2 is a block diagram of the DDS portion of the controller of FIG. 1 arranged in accordance with the principles of the present invention.

FIG. 2 depicts a general block diagram of the control system for generating a RF output signal in accordance with the principles of the present invention. FIG. 2 includes a digital signal processor (DSP) controller 30, which may be integrated as part of controller 20 or RF power amplifier 12 of FIG. 1. DSP controller 30 outputs a phase increment signal and four phase offset signals to an accumulator/synchronizer unit 32. Phase accumulator/synchronizer unit 32 generates four individual RF power signals which are then combined by a combiner 34 to generate a combined RF output signal. A set of feed-back loops 36 provide feedback to DSP controller 30 of the individual RF output signals generated by accumulator/synchronizer 32 and the combined RF output signal combiner 34.

The phase increment signal output by DSP controller 30 generally defines the frequency of the RF power signals output by accumulator/synchronizer 32 and ultimately the combiner RF output signal. The phase offset signals control the offset of the respective one of a number of power generation units in accumulator/synchronizer 32. In this particular example, accumulator/synchronizer 32 houses four individual RF power generation units, each of which outputs an individual RF output or power signal which are combined by combiner 34 to generate a combined RF signal output to RF metrology system 14a in FIG. 1. Phase offset signal 1 controls the offset or phase of a first RF power generation unit, phase offset signal 2 controls the offset or phase of a second power generation unit, phase offset signal 3 controls the offset or phase of a third RF power generation unit, and phase offset signal 4 controls the offset or phase of a fourth power generation unit. It will be understood by one skilled in the art that while the invention described herein is described with respect to four individual power generation units, accumulator/synchronizer 32 may contain greater or fewer than four power generation units. Likewise, combiner 34 may combine the outputs of more or less than four power generation units to define the composite RF output signal or may perform multiple combinations, such as combining already combined signals. More or less than the five feedback loops 36 of FIG. 2 may be utilized in accordance with the number of individual power generation units provided in accumulator/synchronizer 32 and combinations performed in combiner 34.

Figure 3:
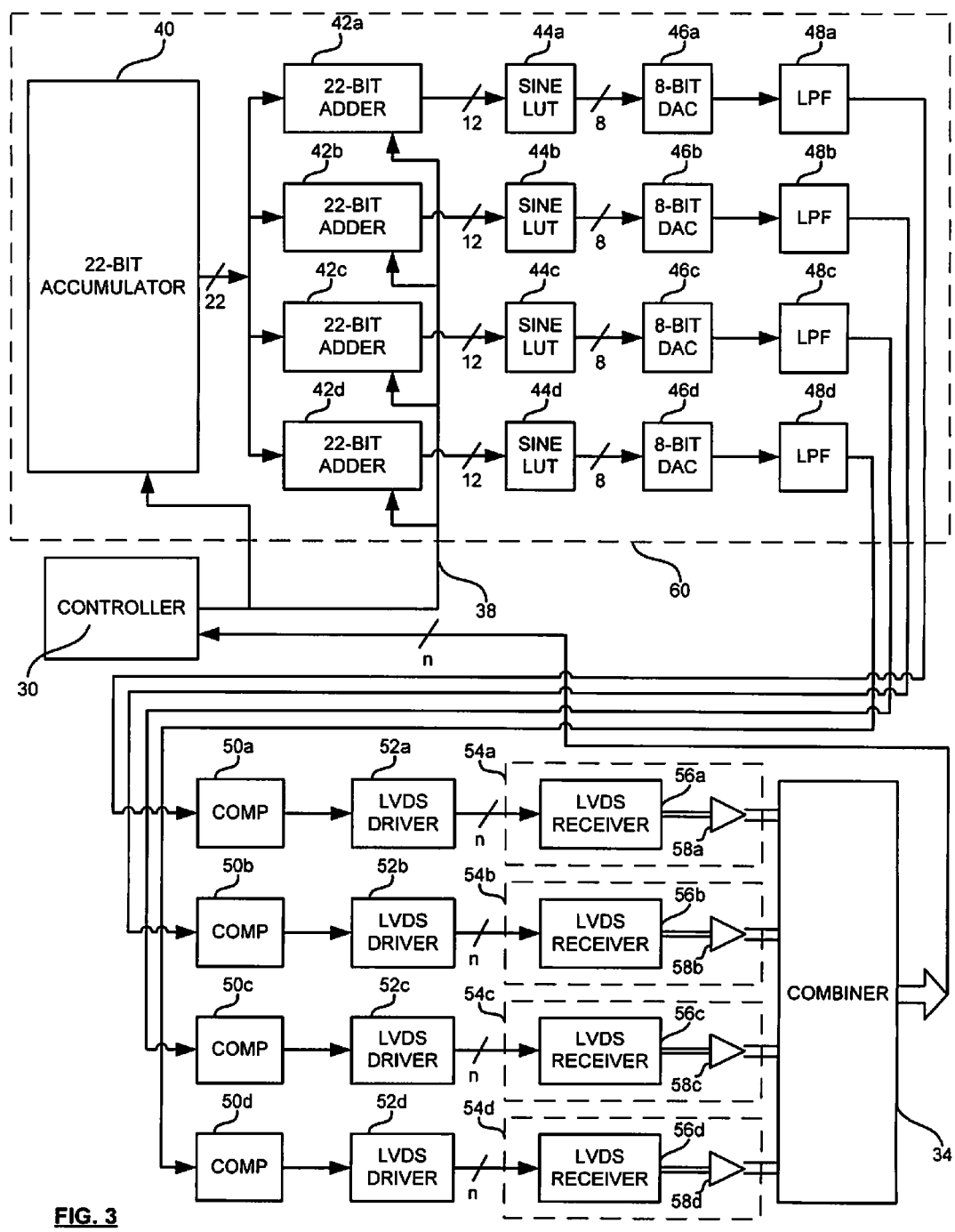
FIG. 3 is an expanded block diagram of the DDS of FIG. 2.

FIG. 3 depicts an expanded block diagram of the DDS of FIG. 2. In particular, DSP controller 30 outputs a plurality of control signals on a bus 38. DSP controller 30 provides a phase increment control signal to 22-bit accumulator 40. A phase offset signal to each of a respective 22-bit adders 42a, 42b, 42c, 42d. It should be noted that throughout the specification, reference numbers having an alphabetical suffix refer to a particular individual power generation unit. The individual channels may also be referred to collectively using the reference numeral without the alphabetical suffix. The 22-bit accumulator 40 generates a signal representative of a frequency of each individual (and combined) RF output signal commanded by DSP controller 30 and outputs an identical 22-bit word to each 22-bit adder 42. Each 22-bit adder 42 adjusts the phase of the RF signal output by each individual RF power generation unit. The signals output by each RF power generation unit are ultimately combined by combiner 34. Each 22-bit adder 42 outputs a 12-bit word to a sine lookup table (LUT) 44a, 44b, 44c, 44d. Each sine lookup table 44 in turn outputs an 8-bit word to a respective 8-bit digital-to-analog converter (DAC) 46a, 46b, 46c, 46d. The 8-bit word output by each sine lookup table 44 digitally represents the magnitude of the sine wave at the frequency and phase defined by the control signals output by DSP controller 30. The digital word output by each respective sine lookup table 44 is then input to each respective 8-bit DAC 46 in order to generate a magnitude signal representative of the RF signal commanded for each respective RF power generation unit by DSP controller 30. The magnitude signal output by each 8-bit DAC 46 is input to a low pass filter (LPF) 48a, 48b, 48c, 48d. As will be described in greater detail, each low pass filter 48 may be implemented as a relatively inexpensive, five element low pass filter and is primarily directed to eliminating spurs within a harmonic range of the RF signal output by each respective RF power generation unit.

The output from each low pass filter 48 is applied to a respective comparator 50a, 50b, 50c, 50d which changes the sinusoidal signal output by each respective low pass filter 48 into a square wave. The square wave drives a low voltage differential signaling (LVDS) driver 52a, 52b, 52c, 52d. It should be noted that 22-bit accumulator 40 through comparators 50a, 50b, 50c, 50d represent the portion of DDS system 26 implemented in a field programmable gate array (FPGA) circuit 60. The output from comparators 50 typically comprises a plurality of output signals applied to each respective LVDS driver 52. LVDS drivers 52 convert the output from comparators 50 into a low voltage differential signal output on a plurality of signal lines and input to a respective RF amplifier 54a, 54b, 54c, 54d. Each amplifier 54 comprises an LVDS receiver section 56a, 56b, 56c, 56d and an amplifier section 58a, 58b, 58c, 58d. LVDS receiver 56 decodes the low voltage differential signal input received from LVDS driver 52 and generates a control signal to each respective amplifier 58. It should be noted that the LVDS driver/receiver combination is used in order to achieve high noise immunity and common mode rejection. RF amplifier 58 in turn generates an RF signal to combiner 34. Combiner 34 receives each input from the respective amplifiers 58 and combines them into a composite RF signal output by combiner 34.

Also of particular relevance with respect to this invention is the low cost implementation. This is achieved because of the highly accurate synchronization and convergence of multiple clock phase outputs using multiple RF generators during startup while having noise spurs—75 dB down over a broad frequency range. The frequency of the first unwanted spur can be described generally by equation 1 below:

$$\{F_c-[2\times F_o]\}+F_o \quad (1)$$

where $F_c$—frequency of the crystal oscillator (in megahertz (MHz)), and $F_o$—required output frequency of the generator (in MHz).

By way of example, if the crystal oscillator frequency is 100 MHz and the frequency of operation is 13.56 MHz, then the first unwanted spur would be at least 86.44 MHz. This spur may easily be removed by a relatively inexpensive low pass filter, such as described with respect to reference numeral 48 in FIG. 3.

With respect to phase resolution, the circuit described above requires only 12-bit accuracy in the offset increment in order to have a phase resolution of 0.1 degrees. At 13.56 MHz, this equates to 0.02 ns or 20 ps, which in turn equates to about 0.25 inches of cable length delay at the speed of light.

An additional feature of the present invention is a DSP controller 30 may store the phase increment applied to 22-bit accumulator 30 and the phase offsets applied to each respective 22-bit adder 42 in DSP controller 30 memory. This virtually eliminates the startup delay required in order to synchronize plasma control systems utilizing prior art DDSs. The relative tunable frequency offsets applied to each 22-bit adder 42 may be stored in memory associated with each RF generation unit, and the programmable phase increment to provide the desired output frequency can be stored in memory associated with each RF generator memory. Storing these values enables a single crystal frequency to provide a common frequency reference to simultaneously create all generator outputs in phase coherence.

The implementation described herein utilizes 8-bit DACs 46 having a 12-bit precision. This provides an output signal which is 75 decibels (dB) above the noise floor, thereby providing an improved signal to noise ratio. While the invention described herein has been described with respect to a particular implementation, one skilled in the art will recognize that implementations having varying resolutions and output word sizes will be equally applicable in accordance with various design considerations.

The above invention provides a significantly reduced startup time once the plasma control system has initially calibrated. Further, having the capability to vary the phase of each RF power generation unit with a given frequency signal enables correcting variations in each RF power generation channel. Such corrections may be stored in memory thereby providing the significantly reduced startup time. Further yet, by being able to quickly vary the phase of each RF power generation unit, various interferences between the individual RF power output signal, both constructive and destructive, can be obtained in order to vary the power of the individual RF power generation units and ultimately the combined RF output signal.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A direct digital synthesizer (DDS) comprising:
an accumulator, the accumulator receiving a phase increment signal and generating a frequency signal having frequency information, the signal varying in accordance with the phase increment signal, the frequency signal being split into a plurality of frequency signals;
a plurality of adders, each adder receiving a respective one of the split frequency signals, each adder also receiving a respective phase offset signal, the phase offset signal defining a phase shift for the frequency signal input to the respective adder, wherein each adder of plurality of adders output a phase shifted frequency signal;
a plurality of lookup tables corresponding to the plurality of adders, the lookup tables receiving a respective phase shifted frequency signal and generating a magnitude signal in accordance with the respective phase shifted frequency signal;
a plurality digital-to-analog converters (DACs), each DAC corresponding to a respective one of the lookup tables and receiving a respective phase shifted frequency signal, each DAC generating a generally periodic analog signal corresponding to the respective phase shifted frequency signal;
a plurality low pass filters (LPFs), each LPF corresponding to a respective one of the DACs and receiving a respective periodic analog signal, each LPF filtering the periodic analog output signal from the respective DAC to generate a sinusoidal signal; and
a plurality of conversion circuits each corresponding to a respective LPF for converting the respective sinusoidal signal to a respective square wave signal.

2. The DDS of claim 1 further comprising a plurality of low voltage differential signaling (LVDS) circuits each corresponding to a respective conversion circuit, each LVDS receiving a respective square wave signal and encoding the received square wave signal into a respective low voltage differential signal.

* * * * *